United States Patent
Forrest et al.

(10) Patent No.: US 10,424,612 B2
(45) Date of Patent: Sep. 24, 2019

(54) METHOD OF FORMING A SEMICONDUCTOR DEVICE

(71) Applicant: The Regents of the University of Michigan, Ann Arbor, MI (US)

(72) Inventors: Stephen R. Forrest, Ewing, NJ (US); Xin Xu, Ewing, NJ (US); Christopher Kyle Renshaw, Ewing, NJ (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 212 days.

(21) Appl. No.: 15/180,537

(22) Filed: Jun. 13, 2016

(65) Prior Publication Data

US 2017/0084666 A1     Mar. 23, 2017

Related U.S. Application Data

(62) Division of application No. 13/034,776, filed on Feb. 25, 2011, now Pat. No. 9,373,666.

(51) Int. Cl.
*H01L 27/146* (2006.01)
*H01L 51/00* (2006.01)
(Continued)

(52) U.S. Cl.
CPC .. *H01L 27/14692* (2013.01); *H01L 27/14612* (2013.01); *H01L 27/307* (2013.01); *H01L 27/3253* (2013.01); *H01L 51/0021* (2013.01); *H01L 51/0097* (2013.01); *H05K 13/046* (2013.01); *H01L 27/14609* (2013.01); *H01L 51/0022* (2013.01); *H01L 2251/5338* (2013.01); *Y02E 10/549* (2013.01); *Y10T 29/4913* (2015.01); *Y10T 29/49128* (2015.01)

(58) Field of Classification Search
CPC ......... H01L 27/14692; H01L 27/14612; H01L 51/0097; H01L 51/0021; H01L 51/0022; Y10T 29/4913; Y10T 29/49128
See application file for complete search history.

(56) References Cited

U.S. PATENT DOCUMENTS 3,766,308 A    10/1973  Loro
6,392,143 B1    5/2002  Koshio
(Continued)

FOREIGN PATENT DOCUMENTS

EP    1450587    8/2004
JP    2004/014447    1/2004
(Continued)

OTHER PUBLICATIONS

Sheet on Silicon Electrical Properties, Mar. 30, 2008.
(Continued)

*Primary Examiner* — A. Dexter Tugbang
*Assistant Examiner* — Jeffrey T Carley
(74) *Attorney, Agent, or Firm* — Riverside Law LLP

(57) ABSTRACT

A method of forming a semiconductor device includes the steps of providing a first circuit layer including a plurality of first contacts, providing one or more semiconductor devices disposed on a stamp, the one or more semiconductor devices including a plurality of second contacts, bonding the plurality of second contacts to the plurality of first contacts via a pressure applied by the stamp.

15 Claims, 20 Drawing Sheets

(51) Int. Cl.
 *H01L 27/30* (2006.01)
 *H01L 27/32* (2006.01)
 *H05K 13/04* (2006.01)

(56) References Cited

U.S. PATENT DOCUMENTS

| | | | |
|---|---|---|---|
| 2002/0148113 A1 | 10/2002 | Forrest et al. | |
| 2002/0158324 A1* | 10/2002 | Hamaguchi | H01L 23/13 257/686 |
| 2002/0158325 A1* | 10/2002 | Hamaguchi et al. | H01L 23/02 257/686 |
| 2002/0197771 A1* | 12/2002 | Dotta | H01L 21/563 438/114 |
| 2004/0121568 A1 | 6/2004 | Kim et al. | |
| 2005/0000634 A1* | 1/2005 | Craig | G06K 19/07718 156/230 |
| 2005/0116616 A1 | 6/2005 | Koeda | |
| 2005/0250245 A1* | 11/2005 | Riedl | H01L 23/13 438/106 |
| 2006/0188697 A1 | 8/2006 | Lee | |
| 2007/0004079 A1 | 1/2007 | Geefay et al. | |
| 2008/0202673 A1 | 8/2008 | Forrest et al. | |
| 2008/0210954 A1 | 9/2008 | Lee et al. | |
| 2009/0020910 A1* | 1/2009 | Forrest | H01L 51/0004 264/259 |
| 2010/0189837 A1 | 7/2010 | Forrest et al. | |

FOREIGN PATENT DOCUMENTS

| | | |
|---|---|---|
| WO | 2007/017470 | 2/2007 |
| WO | 2009/102786 | 8/2009 |

OTHER PUBLICATIONS

Petersen, Kurt E., "Silicon as a Mechanical Material", Proceedings of the IEEE, vol. 70, No. 5, May 1982, pp. 420-456.

McKeen et al., Polyethylene Terephthalate Glycol-Modified—PETG, Film Properties of Plastics and Elastomers, Chapter 20, 2d ed. 2004, pp. 73-74.

International Search Report in PCT/US2012/026611 Application.

* cited by examiner

METHOD OF FORMING A SEMICONDUCTOR DEVICE

CROSS-REFERENCE TO RELATED APPLICATIONS

This application is a divisional of U.S. patent application Ser. No. 13/034,776, filed on Feb. 25, 2011, now U.S. Pat. No. 9,373,666, the contents of which is incorporated by reference herein in its entirety.

STATEMENT AS TO RIGHTS TO INVENTIONS MADE UNDER FEDERALLY SPONSORED RESEARCH OR DEVELOPMENT

This invention was made with U.S. Government support under Contract No. CECOM W15P7T-08-C-P409 awarded by the Army Contracting Command. The government has certain rights in this invention.

STATEMENT REGARDING JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to forming semiconductor and other electrical circuit devices by bonding pre-formed circuit layers to one another using cold welding techniques. Aspects of the invention may also be advantageously used in processes including bonding circuits on non-planar substrates using a stamp.

BACKGROUND OF THE INVENTION

Metals, organics, and other solid materials may be deposited on a flexible substrate, which is then deformed into a desired configuration after the material has been deposited. For example, a metal electrode may be deposited on a flexible substrate for use in an organic light emitting device. However, such a substrate does not allow for arbitrarily-shaped devices to be formed since the flexible substrate and/or any layers deposited on the substrate may be damaged or destroyed if the substrate is deformed beyond a certain point. For example, a flexible indium tin oxide (ITO) substrate can be rolled, but can not be formed into a dome or other ellipsoidal shape without damaging the substrate or layers on the substrate. Deposition of material onto a non-planar substrate would be useful for a variety of applications, including organic light emitting and photosensitive devices and other optical applications.

Aspects of depositing thin layers of material onto a non-planar substrate by stamping have been addressed in US Patent Application Publication No. 2009/0020910 by Forrest et al. and US Patent Application Publication No. 2010/0189837 by Forrest et al., the contents of which are incorporated herein by reference.

In the field of circuit board assembly, components on substantially flat boards may typically joined together by, for example, surface mount technology techniques (SMT) using surface mount device (SMD) soldering, and thru-hole soldering techniques. SMT methods may employ various combinations of solder pads on the printed circuit board (PCB) and solder paste on contacts of the components, which are bonded together by heating the board and all components. In the case of thru-hole soldering, typically used for prototyping or when fixing bulkier components, leads of the components are inserted into plated through-holes (PTH) drilled in the PCB and soldered to pads on the opposite side either by manual assembly or by the use of automated insertion mount machines. However, the known SMT and thru-hole techniques have limitations in their various abilities to, for example, effectively bond components without damaging heat-sensitive materials (such as in the case of SMD soldering), or rapidly assemble and bond components to small and/or irregular surfaces (such as in the case of thru-hole soldering).

BRIEF SUMMARY OF THE INVENTION

According to aspects of the invention, systems and methods including bonding two or more separately formed circuit layers may be achieved using, for example, cold welding techniques. In embodiments, processing techniques may be provided for combining inorganic and/or organic semiconductor devices in apparatus including, for example, microchips, optoelectronic devices, such as solar cells, photodetectors and organic light emitting diodes (OLEDs), and other apparatus with multi-layer circuitry. As described herein, exemplary methods of bonding preformed circuit layers may include the use of stamping and pressure bonding contacts of two or more circuit layers together. Such methods may find applicability, for example, in bonding circuitry to shaped substrates, including various rounded and irregular shapes, and may be advantageously used to combine devices with different structural properties, e.g. from different materials systems.

Embodiments may include methods of forming an electrical circuit structure including providing a first circuit layer with a plurality of first contacts, and providing one or more semiconductor devices disposed on a stamp, the one or more semiconductor devices including a plurality of second contacts. The plurality of second contacts may be bonded to the plurality of first contacts via a pressure applied by the stamp. In embodiments, the bonding may include, for example, cold welding.

In embodiments, the first circuit layer may be disposed on a curved surface. The curved surface may include a non-developable surface. Exemplary methods may include aligning the second contacts at least partially around a curved surface, such as a one-dimensional curved surface, a two-dimensional curved surface, and/or a non-developable surface, in three dimensions such that the second contacts are aligned with the plurality of first contacts before the bonding.

Embodiments may also include providing a circuit sublayer under the first circuit layer. A photodiode material may be disposed between the circuit sublayer and the first circuit layer. In embodiments, the photodiode material may be an organic photodiode material. In embodiments, the circuit sublayer may be stamped to a first substrate and the photodiode material may be disposed over the circuit sublayer by deposition. In embodiments, the first substrate may be formed from a plastic material.

Embodiments may include stamping the first circuit layer over a photodiode material. In embodiments, the first circuit layer may be stamped on a curved surface, including, for example a non-developable surface. In embodiments, the first circuit layer may include drive contacts, scan contacts, and/or gate contacts.

In embodiments, the one or more semiconductor devices disposed on the stamp may include an array of thin film transistors and/or the plurality of first contacts may be connected to an array of photodiodes.

According to other aspects of the invention an electrical circuit device may include a first circuit layer including a plurality of first contacts and a second pre-formed layer including one or more semiconductor devices. The one or more semiconductor devices may include a plurality of second contacts and the plurality of second contacts may be bonded to the plurality of first contacts via a cold welded material.

In embodiments, the first circuit layer of the device may be disposed on a curved surface. The curved surface may include, for example, a non-developable surface.

In embodiments, the device may include a circuit sublayer under the first circuit layer and a photodiode material disposed between the circuit sublayer and the first circuit layer. In embodiments, the photodiode material may be an organic material. The first circuit layer may be disposed on a curved surface, such as a one-dimensional curved surface, a two-dimensional curved surface, and/or a non-developable surface.

In embodiments, the one or more semiconductor devices of the second pre-formed layer may include an array of thin film transistors and/or the plurality of first contacts may be connected to an array of photodiodes.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings.

DETAILED DESCRIPTION OF THE INVENTION

Figure 1:
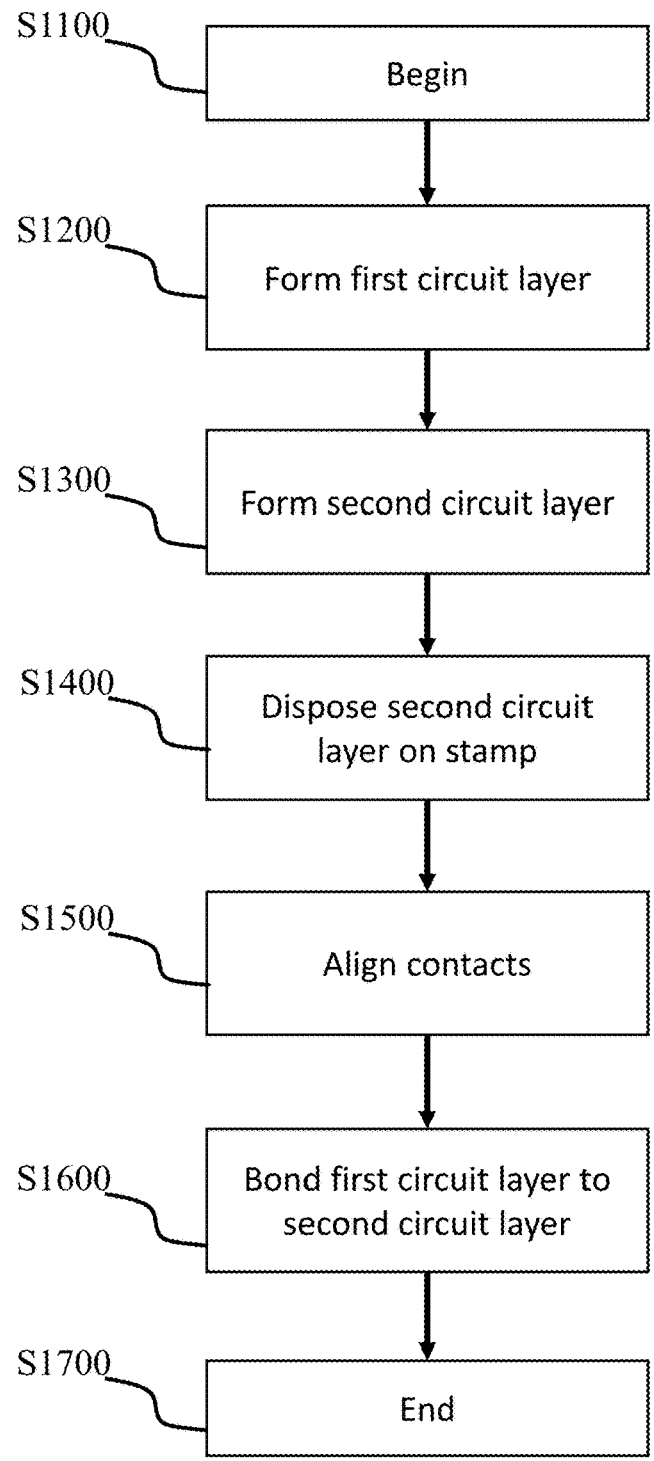
FIG. 1 is flow chart depicting aspects of a first exemplary method according to aspects of the invention.

It is understood that the invention is not limited to the particular methodology, protocols, and reagents, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a contact" is a reference to one or more contact and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law.

Moreover, it is noted that like reference numerals reference similar parts throughout the several views of the drawings.

The following preferred embodiments may be described in the context of exemplary OLED devices, some of which may include curved surfaces, for ease of description and understanding. However, the invention is not limited to the specifically described devices and methods, and may be adapted to various circuit assemblies without departing from the overall scope of the invention. For example, devices and related methods including concepts described herein may be used for the assembly of microchips, optoelectronic devices, such as solar cells and photodetectors, and other apparatus with multi-layer circuitry.

FIG. 1 is a flow chart depicting aspects of a first exemplary method according to aspects of the invention. As shown in FIG. 1, a method of forming an electrical circuit structure may begin in S1100 and proceed to S1200, where a first circuit layer is formed. Formation of the first circuit layer may include, for example, forming various combinations of anodes, contacts and/or active materials and other components known to those of skill in the art. In embodiments, the first circuit layer may include a combination of data and scan (D/S) circuitry, and/or gates, over an organic photo diode (OPD) material and an array of anodes beneath the OPD. The first circuit layer may include a plurality of first contacts, such as contacts of the D/S and gates. The method may continue with S1300.

In S1300 a second circuit layer may be formed. Formation of the second layer may include, for example, forming one or more semiconductor devices including a plurality of second contacts. In embodiments, the one or more semiconductor devices may include devices, such as, thin film transistors (TFTs), pixels, and/or associated interconnects and contacts. The formation of such devices may be accomplished by techniques known in the art, as well as by, for example, bonding elements of TFTs structures together by cold welding. In embodiments, such methods may include bonding a substrate with a plurality of TFTs to a film including a plurality of interconnects. The method may continue with S1400.

In S1400, the one or more semiconductor devices may be disposed on a stamp, such as, for example, a rigid stamp or an elastomeric stamp. The stamp may be made of, for example, a substance that is readily patterned or easily fabricated from a mold. Examples of suitable materials that may be used to form stamps in accordance with embodiments of the present invention include soft substances such as poly(dimethylsiloxane) ("PDMS"), hard substances such as silicon, glass, quartz, steel and hard metals, as well as other materials known to those skilled in the art, and combinations thereof. As described further below, a stamp may be used to temporarily hold the second circuit layer, and the like, and, while holding the second circuit layer, to position contacts of the second circuit layer with respect to contacts of the first circuit layer. The method may continue with S1500.

In S1500, the contacts of the one or more semiconductor devices held by the stamp may be aligned with contacts of the first circuit layer. For example, in embodiments, D/S contacts patterned on TFTs of the second circuit layer may be aligned with corresponding contacts on the D/S circuitry of the first circuit layer. In embodiments, the contacts may be aligned in three dimensions, such as aligning the contacts of the second circuit layer around a curved surface of the first circuit layer. The method may continue with S1600.

In S1500, the second circuit layer held by the stamp may be bonded to the first circuit layer via a pressure applied by the stamp. For example, the contacts of the one or more semiconductor devices held by the stamp may be bonded to the plurality of first contacts on the first circuit layer via a pressure applied by the stamp. In embodiments, the bonding may include, for example, cold welding the respective contacts of the second circuit layer to the contacts of the first circuit layer.

As used herein, cold welding refers to bonding of materials at about room temperature due to an application of pressure, such as, for example, bonding between two metals and/or other materials. Additional information regarding cold welding is provided in US Patent Application Publication No. 2004/0121568, filed Mar. 13, 2003 by Kim et al., the disclosure of which is incorporated by reference in its entirety. For example, as described in Kim et al., cold welding may be used to bond separate metal or organic parts of macroscopic size. The surfaces of the parts may bond to each other when the interfacial separation is decreased below a critical value, resulting in a single solid. In order to achieve good patterns by this technique, the applied pressure should typically be high enough to decrease the interfacial separation below the critical value. It should be noted that the term "cold welding" is used herein to refer to various bonding of materials, including organic-to-organic bonding, even though the term "welding" is typically used only in connection with metal-to-metal bonding.

Aspects of the present subject matter may advantageously allow for the fabrication of organic electronic devices, such as organic thin film transistors (OTFTs), which may include relatively fragile molecular solids and the like, where damage inflicted by application of excessive pressure and/or heat, such as to the active device regions, should be avoided. Accordingly, the methods of the invention are well suited for processing of various integrated circuits, including organic integrated circuits, where contacts for various components such as OTFTs, organic light-emitting diodes (OLEDs), solar cells, and photodetectors must be simultaneously patterned and/or bonded.

In embodiments, a chemical reaction may also occur or be induced to assist with material transfer or strengthen the bond between the contacts of the first and second circuit layers, and the like. Additional curing or bonding agents may be used to improve or affect the transfer of material. For example, ultraviolet light, or an oxidizing agent may be applied to the stamp, a substrate of the first circuit layer, or both. Such agents may be applied in the configurations previously referenced, or they may be applied before pressure is applied via the stamp.

After bonding of the first circuit layer to the second circuit layer, the method may, for example, repeat with any number of additional bonding steps, or the method may conclude with S1700.

Figure 2:
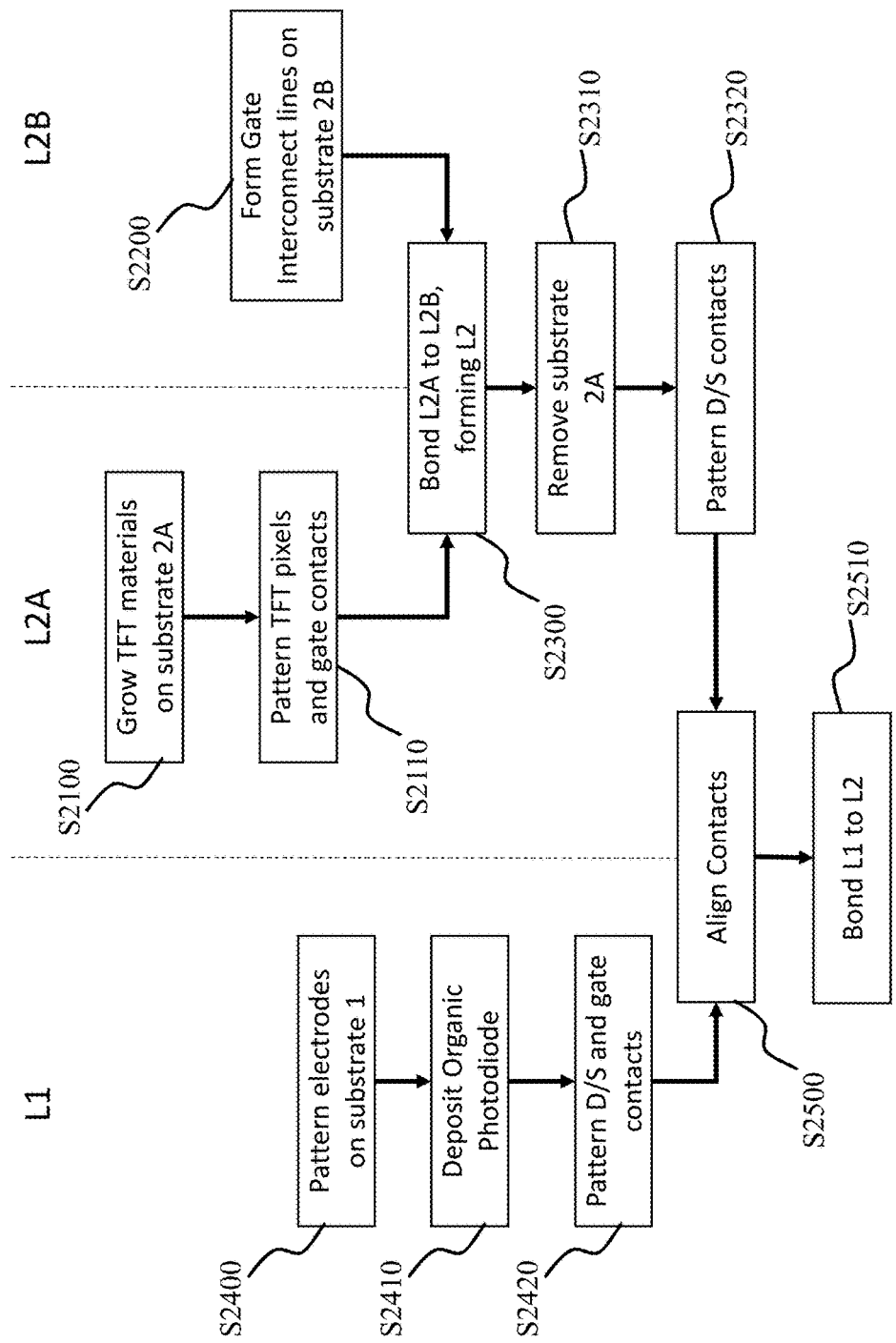
FIG. 2 is flow chart depicting further aspects of an exemplary method according to aspects of the invention.

Further details of an exemplary method of forming an OLED device in accordance with aspects of the invention are described with reference to the flow chart in FIG. 2, and the additional schematic diagrams in FIGS. 3-17.

Figure 3:
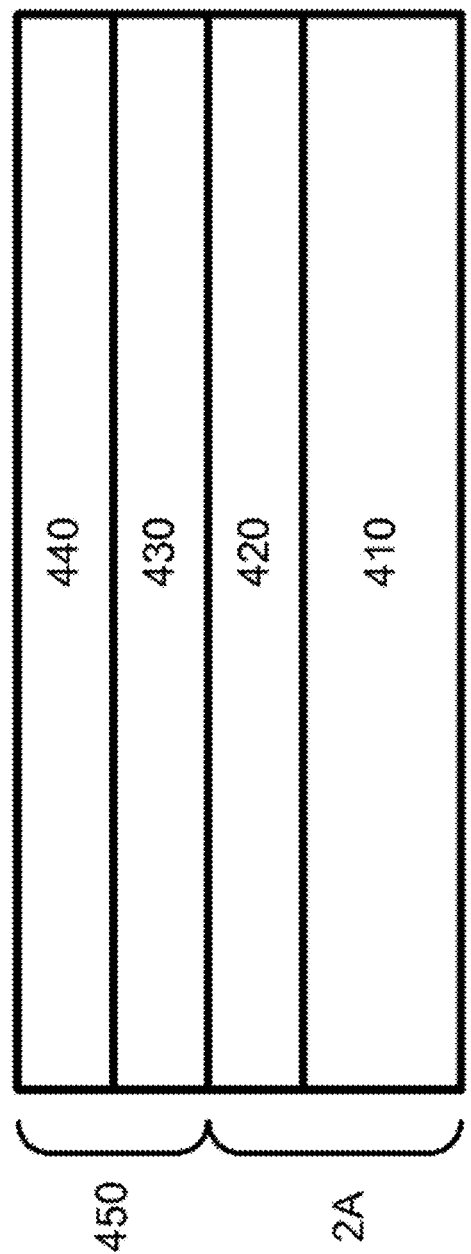
FIG. 3 is a schematic diagram of an exemplary substrate for further processing according to aspects of the invention.

As discussed with reference to FIG. 2, an exemplary method of fabricating an electro-optical device may include the formation of various layers including L1, L2A and L2B. As described further below, layers L2A and L2B may be bonded during the process to a form a combined layer L2, and combined layer L2 may be subsequently bonded to layer L1. The formation of layer L2A may begin with S2100 in which TFT materials are disposed and/or grown on a substrate 2A, such as an Indium Phosphide (InP) substrate. In embodiments, substrate 2A may be substantially planar, or "2-dimensional." A depiction of an exemplary substrate with TFT material is shown in FIG. 3, including a multi-layer substrate 410, 420, and TFT layer 450 including materials 430, 440. Materials 430, 440 may be those TFT materials known by those of skill in the art, including, for example, various silicon or metal oxides, such as indium tin oxide (ITO), etc. The method may continue with S2110.

Returning to FIG. 2, in S2110, the layer L2A may be patterned by techniques known in the art, such as lithography, to form a plurality of pixels and gate contacts on the substrate 2A. Further details of such steps are shown in FIGS. 3 and 4.

Figure 4:
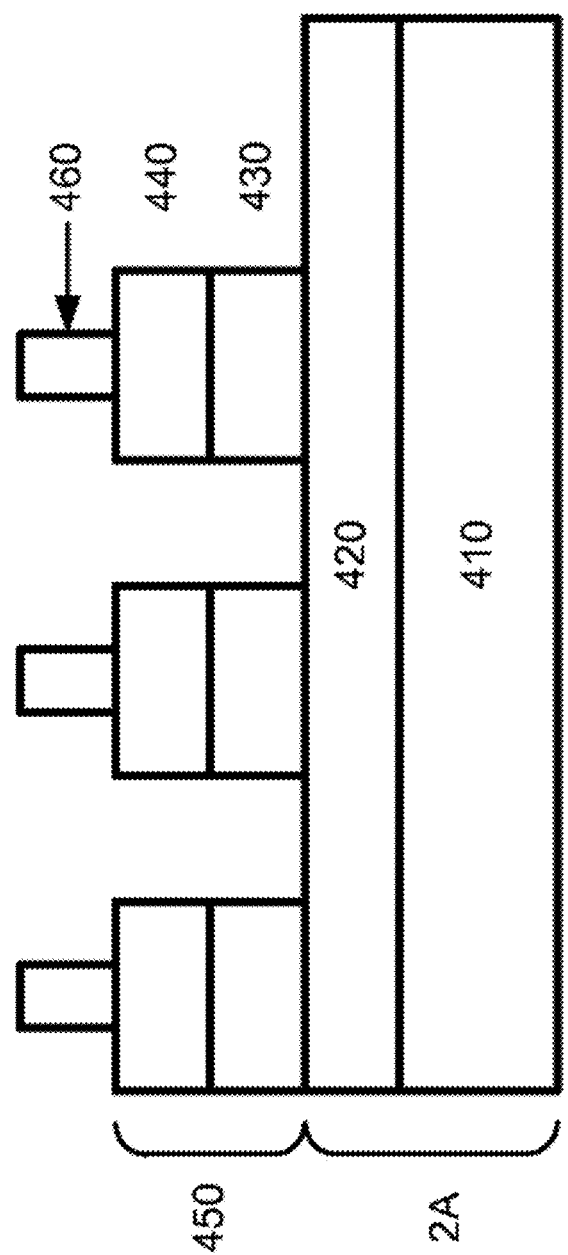
FIG. 4 is a schematic diagram of the substrate in FIG. 3, after further processing to form TFT elements.
Figure 5:
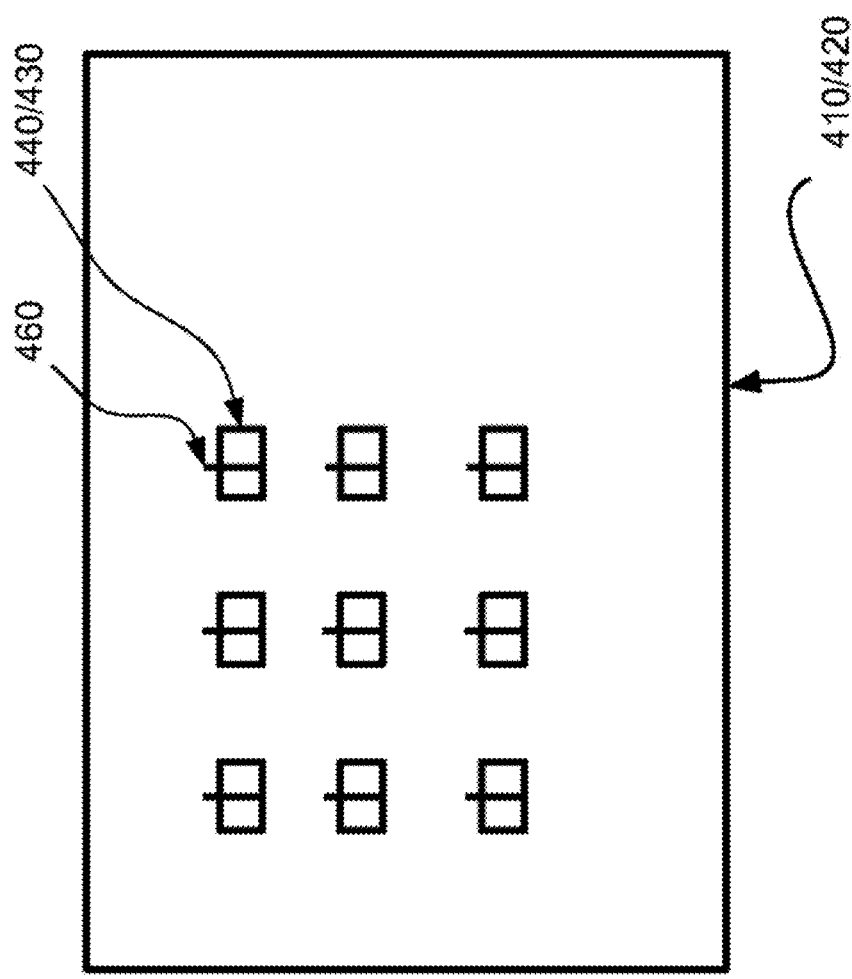
FIG. 5 is a plan view of the processed substrate and TFT elements in FIG. 4.

As shown in FIGS. 3 and 4, a plurality of TFT pixels may be formed over substrate 2A from TFT materials 430, 440. Gate contacts 460 may also be patterned over the TFT materials. The gate contacts 460 may be positioned to coincide with gate interconnect lines to be added by another layer L2B, described further below.

Figure 6:
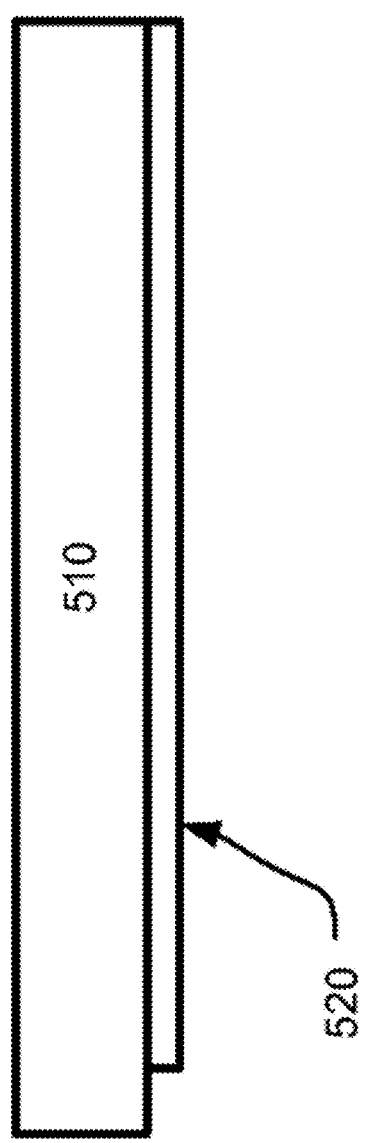
FIG. 6 is a schematic diagram of an exemplary second substrate with interconnects for further processing according to aspects of the invention.
Figure 7:
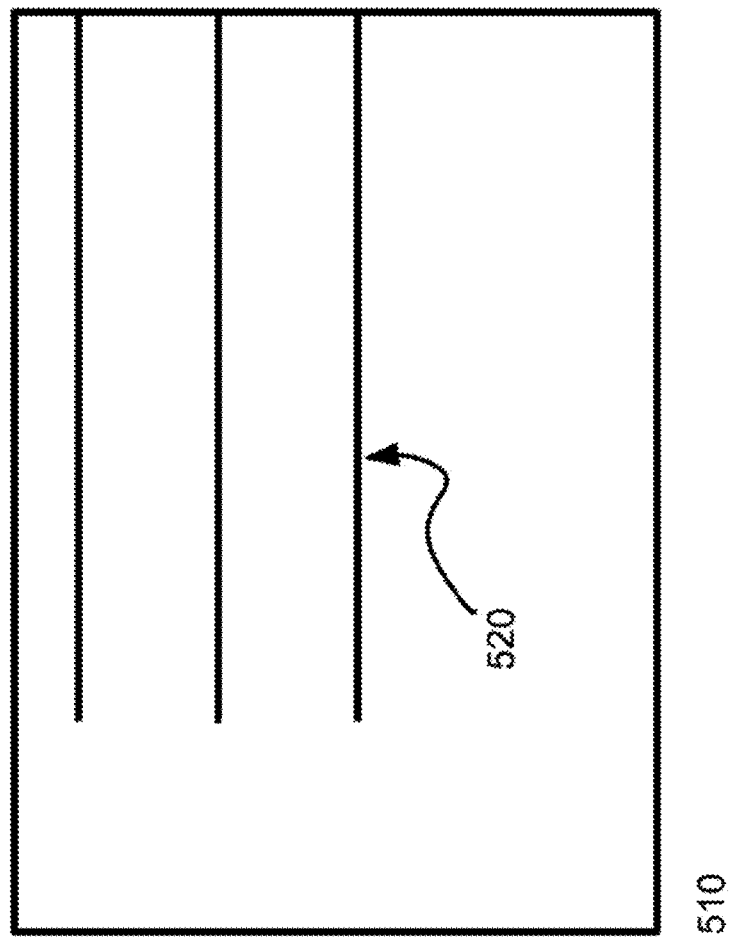
FIG. 7 is a plan view of the second substrate in FIG. 6.

Returning to FIG. 2, formation of a layer L2B may begin with S2200 where a plurality of gate interconnect lines may be formed on a substrate 2B. An example of such steps is shown in FIGS. 6-7. FIG. 6 is a side view of an exemplary substrate 510 showing a profile of a gate interconnect line 520. FIG. 7 is a plan view showing a plurality of gate interconnect lines 520 transferred to a substrate 510. In embodiments, the substrate 510 may be, for example, a Kapton® film, a polydimethylsiloxane (PDMS) film, and the like. Any number of gate interconnects, and the like, may be formed on substrate 510. The gate interconnect lines 520 are disposed and/or patterned on the substrate 510 to coincide with the gate contacts 460 shown in FIG. 5 and described above.

Returning to FIG. 2, the method may continue with S2300 during which layers L2A and L2B may be bonded to one another. As an initial step, layers L2A and L2B may be aligned such that the gate interconnect lines 520 on the substrate 510 (2B) coincide with the gate contacts 460 on the substrate 410/420 (2A). Once aligned, layers L2A and L2B may be bonded to one another, for example using cold welding. Further details of such bonding are shown in FIGS. 8 and 9.

Figure 8:
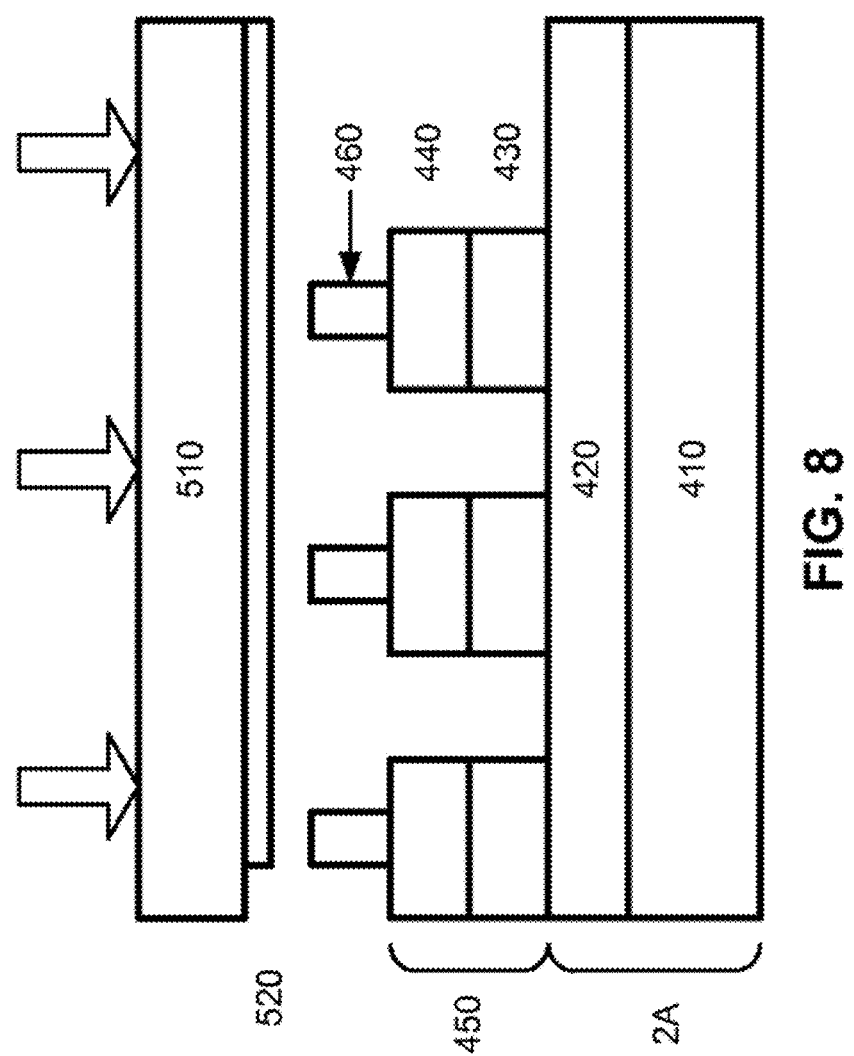
FIG. 8 is a schematic diagram depicting bonding of the processed substrate in FIG. 4 and the second substrate with interconnects in FIG. 6.

FIG. 8 is a side view of an exemplary substrate 510 positioned for bonding to the TFTs of substrate 2A. As shown in FIG. 8, a pressure, represented by the large arrows in FIG. 8, may be applied via a stamp to the substrate 510 and the gate interconnect lines 520 bonded to the gate contacts 460 via the pressure. As mentioned previously, such bonding may be achieved without conventional soldering techniques by using, for example, appropriate metallic and/or organic materials in the gate interconnect lines 520 and the gate contacts 460 that bond to one another under pressure.

Figure 9:
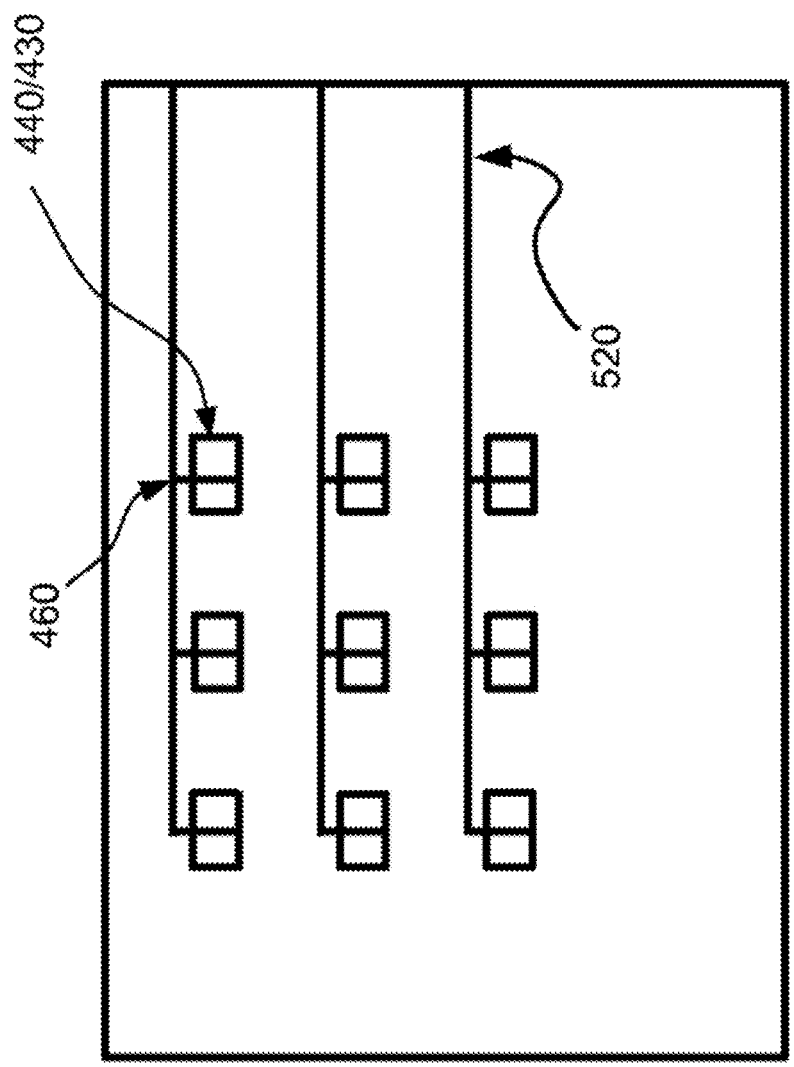
FIG. 9 is a plan view of the bonded substrates and components in FIG. 8.

FIG. 9 is a plan view, with the substrate 510 omitted, showing the alignment of the gate interconnect lines 520 and the gate contacts 460. As discussed herein, after layers L2A and L2B are bonded together, they may be collectively referred to as layer L2. Further processing of the combined layer L2 is discussed below.

Returning to FIG. 2, after bonding of layers L2A and L2B is completed in S2300, the method may continue with S2310. In S2310, combined layer L2 may be processed to remove substrate 2A. According to embodiments, this may include an epitaxial lift-off of the substrate materials 410/420, such as InP. Further aspects of such steps are shown in FIGS. 10 and 11.

Figure 10:
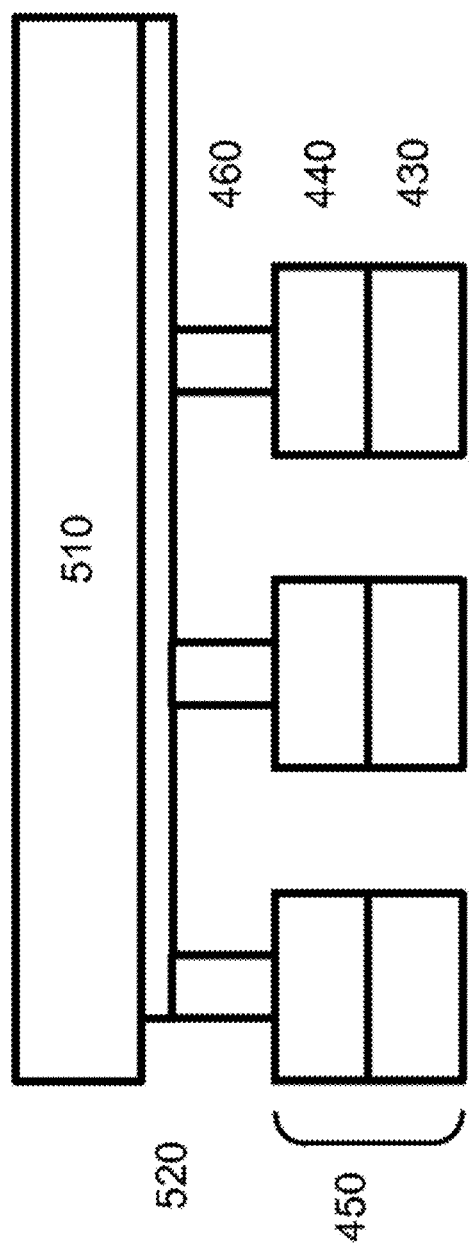
FIG. 10 is a schematic diagram depicting further processing of the bonded substrates and components in FIG. 8.
Figure 11:
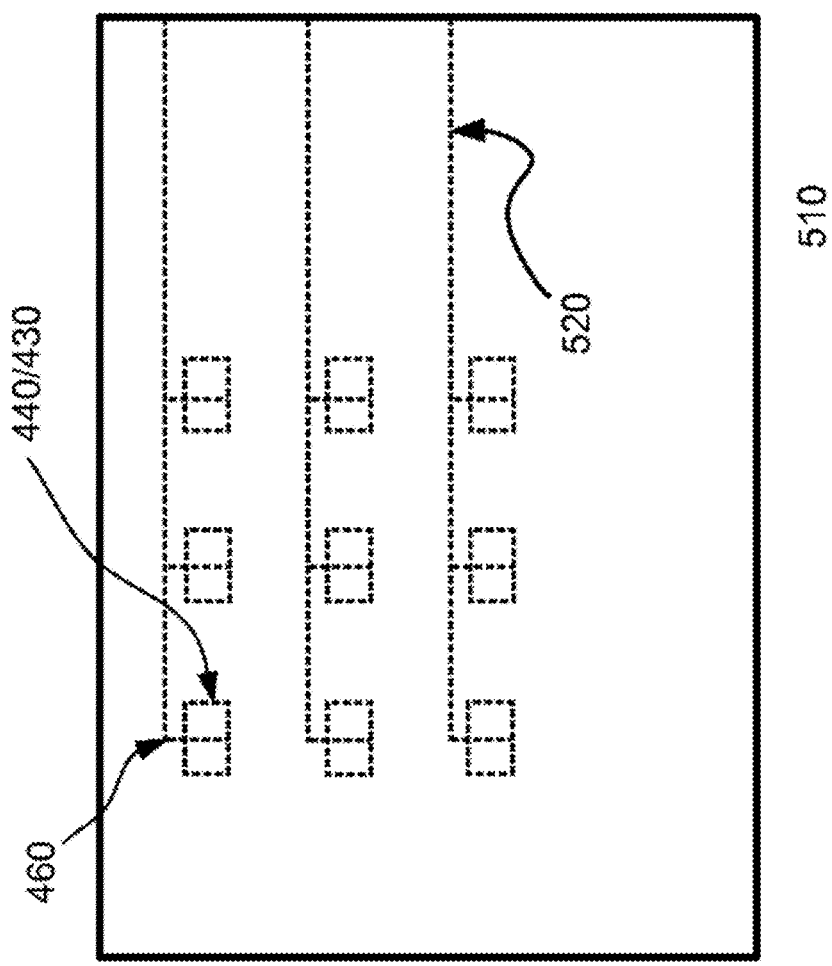
FIG. 11 is a plan view of the bonded substrate and components in FIG. 10.

FIG. 10 is a side view of substrate 510 with bonded TFTs, previously formed from layer 450, after the substrate materials 410/420 (substrate 2A) have been removed. FIG. 11 is a plan view, showing the gate interconnect lines 520 and the gate contacts 460 in dashed lines, as seen through the substrate 510. Processing of the combined layer L2 may continue with S2320 shown in FIG. 2.

In S2320, combined layer L2 may be processed to pattern a plurality of contacts, such as D/S contacts, on the TFTs. In embodiments, this may include bonding the substrate 2B, such as a Kapton® film, to a Si wafer, or the like, for processing such as photolithography. Further aspects of such steps are shown in FIGS. 12 and 13.

Figure 12:
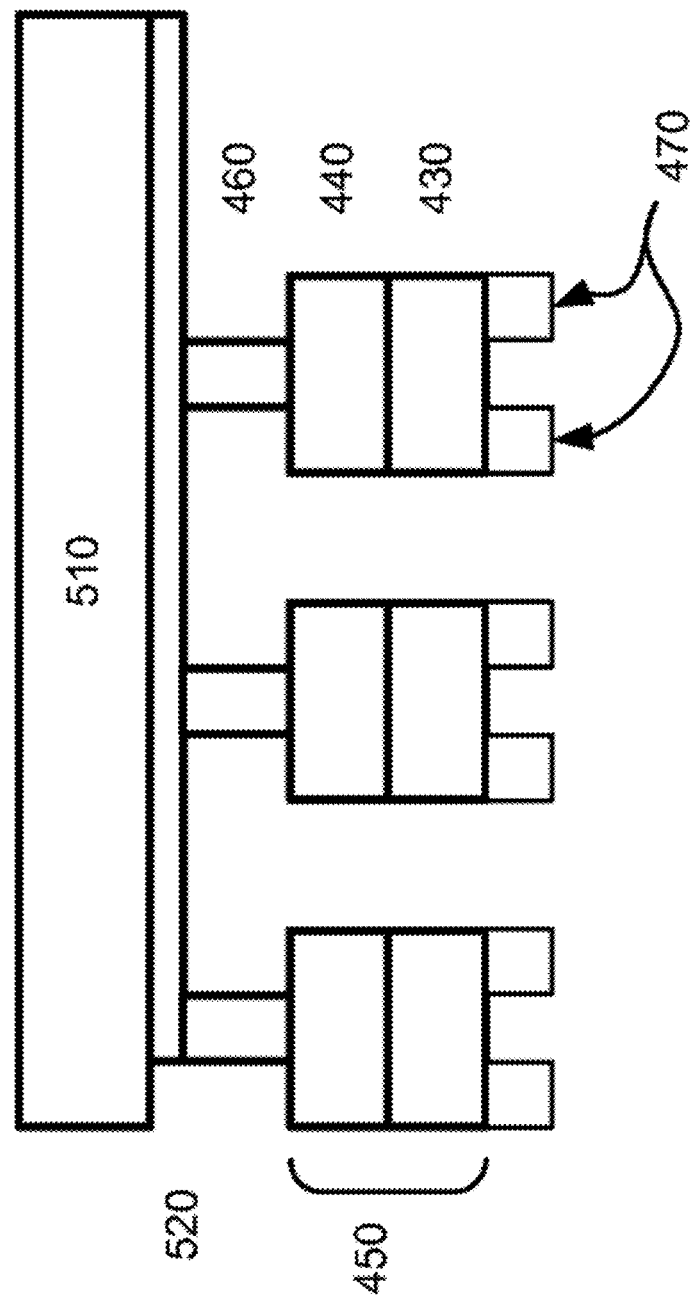
FIG. 12 is a schematic diagram depicting further processing of the bonded substrate and components in FIG. 10.
Figure 13:
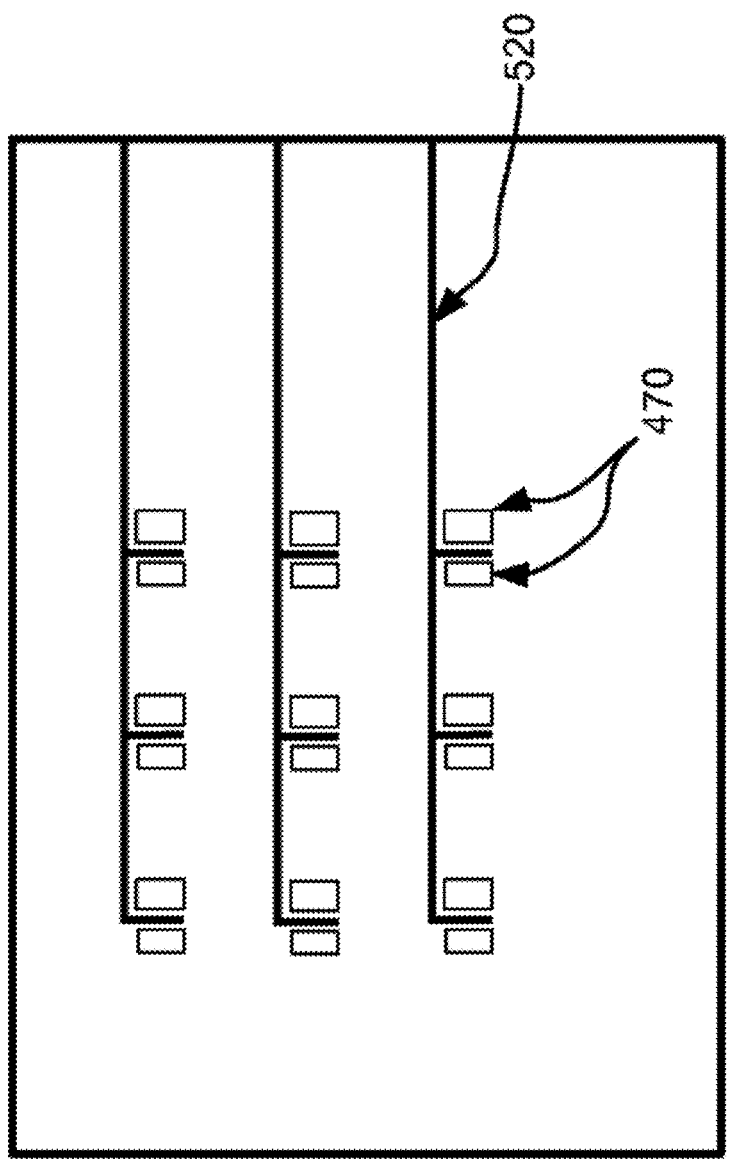
FIG. 13 is a plan view of the bonded substrate and components in FIG. 12.

FIG. 12 is a side view of substrate 510 with bonded TFTs, and D/S contacts 470 formed thereon. As shown in FIG. 12, each of TFT stacks 430/440 include a pair of D/S contacts 470. D/S contacts 470 may be positioned, for example, to coincide with D/S circuitry of another layer L1 described further below. D/S contacts 470 may be formed of various materials including materials suitable for cold welding known by those of skill in the art. FIG. 13 is a plan view, showing the disposition of the D/S contacts 470 with respect to the gate interconnect lines 520. It should be understood that, while the combined circuit layer depicted in FIGS. 12 and 13 may represent an exemplary circuit layer with a plurality of semiconductor devices included thereon, other configurations and semiconductor devices are also contemplated as within the scope of the invention.

Returning to FIG. 2, formation of a layer L1 may begin with S2400 where a plurality of anode electrodes, or the like, may be formed on a substrate 1. In embodiments the electrodes may be formed, for example, by direct patterning, and may be applied to a curved surface of the substrate 1. Further details of an exemplary patterning step are described with reference to FIG. 14.

Figure 14:
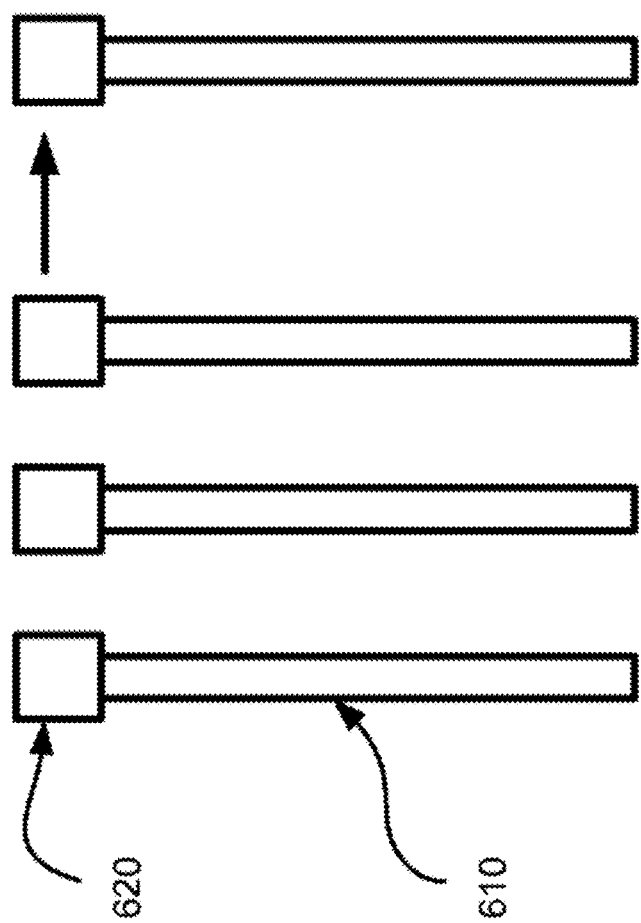
FIG. 14 is a plan view of an exemplary circuit layer on a substrate according to aspects of the invention.

FIG. 14 is a plan view showing a plurality of anode electrode lines 610 and terminals 620. As shown in FIG. 14, any number of lines 610 are possible. The anode pattern shown in FIG. 14 may be disposed, for example, on a curved surface of a substrate (not shown). The curved surface may include a one-dimensional curve, a two-dimensional curve and/or a non-developable surface. In embodiments, the anodes may be patterned on a hemispherical plastic substrate. The anodes may be bonded to a plastic substrate, or the like, for example, by inserting an adhesive layer (e.g. Cr, Ti), or surface treatment (e.g. plasma treatment) to a plastic or other substrate surface. The anode electrodes may be applied to the curved surface of the substrate using, for example, a three-dimensional stamping method, such as those discussed further below, and the like. In embodiments, the substrate (not shown) may be made from a plastic material, a composite material, metal foil, elastomer etc., including materials that are typically not compatible with manufacturing techniques using soldering.

In the case of non-planar substrates, a substrate having one-dimensional curvature, such as the curved surface of a cylinder, may be used. In other embodiments, the substrate has two-dimensional curvature, and the substrate may have at least one surface that is non-developable. That is, the surface is a topological shape that cannot be flattened onto a plane without distortion such as stretching, compressing, or tearing. The entire substrate may be non-developable, such as where a substrate is created by deforming a thin sheet to have a dome or semi-spherical shape. Pressure may be applied between the substrate and the stamp to transfer material, such as the anode electrodes, from the stamp surface to the substrate. After pressure has been applied between the substrate and the stamp, the stamp may be removed from the substrate. Thus a layer of material, such as a patterned layer of electrode material, may be deposited on the substrate surface.

It should be understood that, while the anode electrode layer depicted in FIG. 14 may represent, for example, an exemplary circuit sublayer, other configurations and sublayers with various circuitry are also contemplated as within the scope of the invention.

Returning to FIG. 2, formation of a layer L1 may proceed with S2410 where an organic photodiode (OPD) material may be disposed over the anode electrodes. The OPD material may be disposed in various ways including, for example, vacuum thermal evaporation (VTE). In embodiments, the OPD material may be deposited on a curved surface of the substrate 1 over the anode electrode layer, and may be deposited with a substantially uniform thickness. In other embodiments, the OPD material, or other material applied over the anode electrodes may be patterned, such as, for example, by selective deposition and/or removal techniques known in the art. Further details of an exemplary OPD deposition step are described with reference to FIG. 15.

Figure 15:
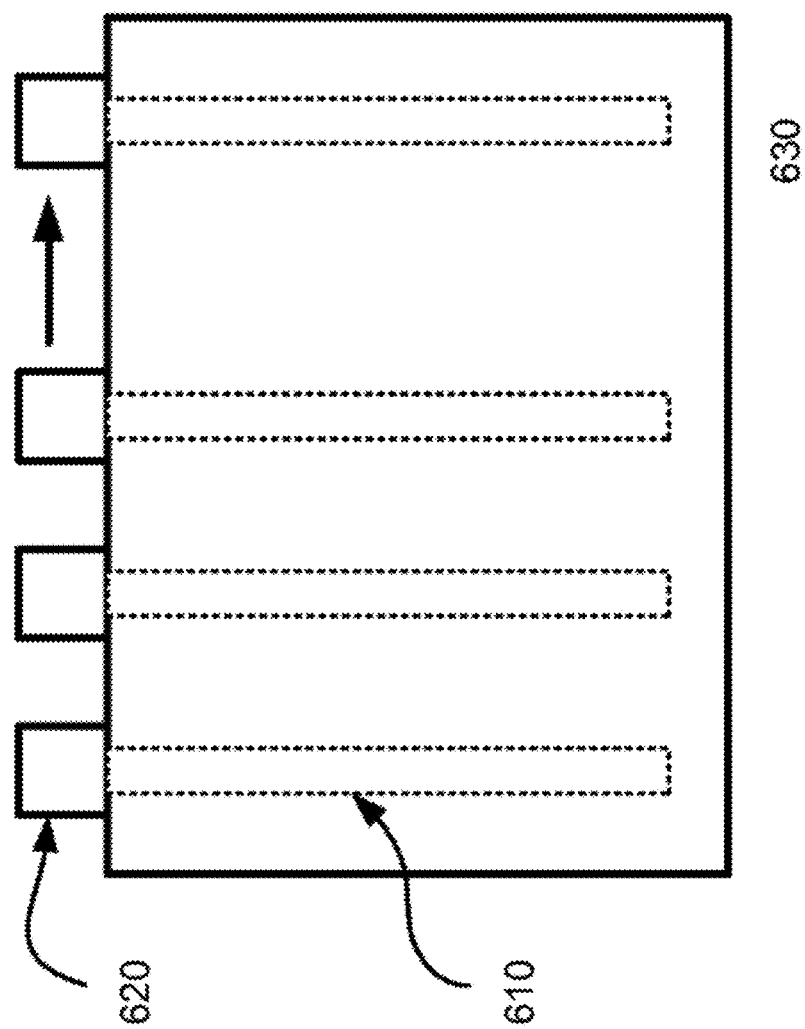
FIG. 15 is a plan view depicting addition of an OPD material over the circuit layer and substrate of FIG. 14.

FIG. 15 is a plan view showing the plurality of anode electrode lines 610 covered by a layer 630 of OPD material. Although shown as substantially rectangular for ease of depiction, it should be understood that the layer 630 of OPD material may be disposed on a non-developable, or other curved, or three-dimensional, surface.

Returning to FIG. 2, formation of a layer L1 may proceed with S2420 where an array of D/S and gate contacts may be formed over the OPD material. For example, a plurality of data lines, scan (gate) lines, and/or gate contacts may be applied over the OPD material, or a strike layer, by direct stamping. Such stamping may include, for example, three-dimensional stamping toward curved surfaces of the underlying substrate. Further details of an exemplary circuit formation step are described with reference to FIG. 16.

Figure 16:
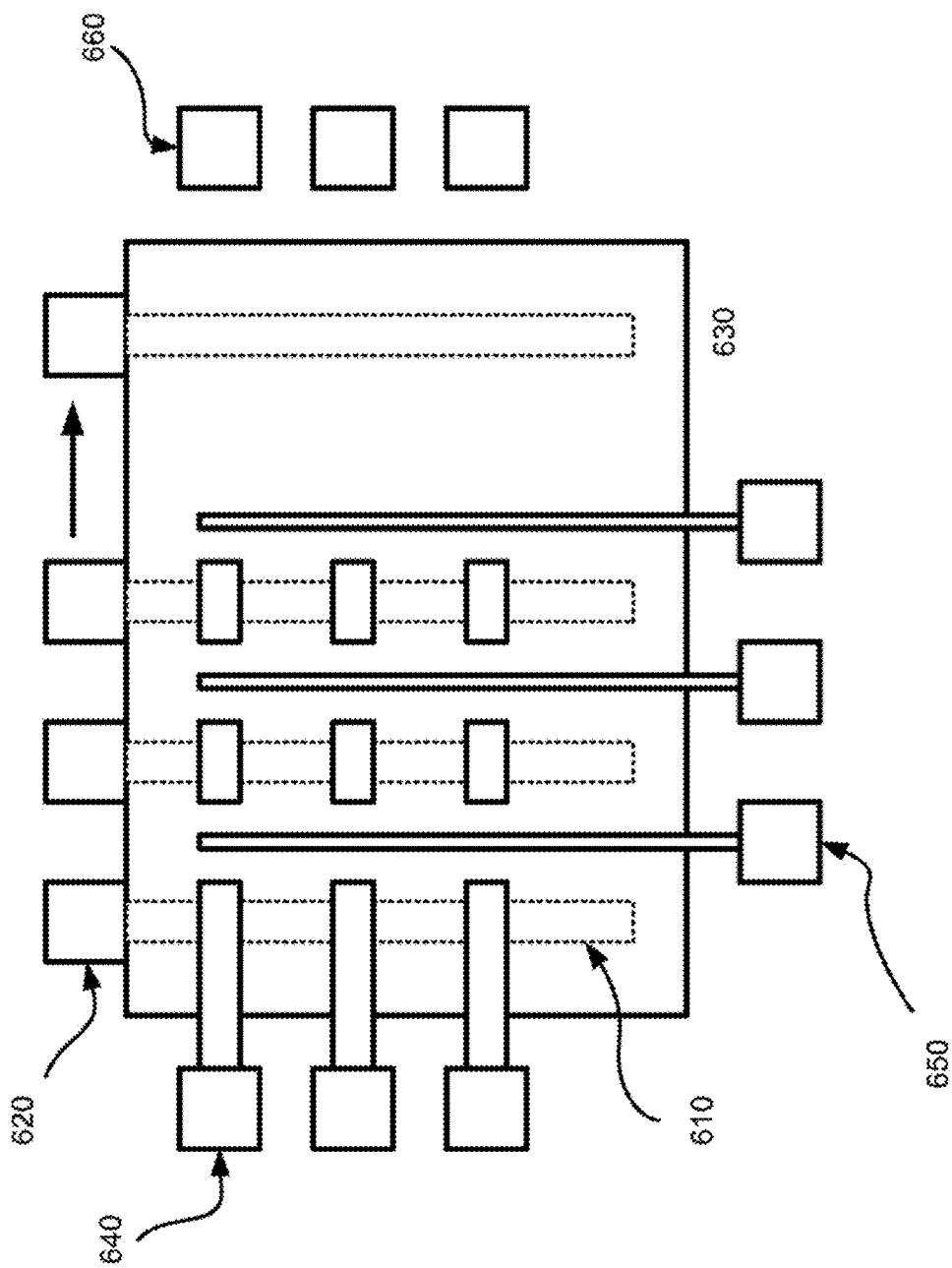
FIG. 16 is a plan view depicting addition of D/S circuitry and gate contacts over the circuit layer and substrate of FIG. 15.

FIG. 16 is a plan view showing the plurality of scan lines 640, data lines 650 and gate contacts 660 over the layer 630 of OPD material. Although shown as substantially rectangular for ease of depiction, it should be understood that the various components depicted in FIG. 16 may be disposed around a three-dimensional surface, such as a hemispherical substrate and other shapes described herein. Scan lines 640, data lines 650 and gate contacts 660 may be disposed in an arrangement to coincide with the D/S contacts 470 and gate interconnect lines 520 previously described with reference to FIG. 13.

Returning to FIG. 2, after the D/S and gate contacts have been applied in S2420, the method may resume with the process of bonding layer L1 and layer L2 together. As an initial step in this process, the layer L2, which includes, for example, a plurality of TFT elements, D/S contacts and gate interconnect lines, may be accommodated on a stamp for bonding to L1. In S2500 contacts on circuit layer L2 may be aligned with corresponding contacts on L1. In embodiments, this may include three-dimensional alignment of the contacts. Alignment may be set at an initial stage of the bonding process and/or may be adjusted during movement and/or deformation of the layer L2 to the shape of layer L1. For example, in embodiments in which layer L1 includes a curved surface, layer L2 may undergo an initial deformation, such as while being held by an elastomeric stamp, to approximate or match a shape of L1. After the deformation, the contacts on L2 may be aligned with the corresponding contacts on L1 such as by adjusting the stamp. Alignment may be further adjusted as the stamp brings L2 and L1 together to the point of bonding. Once the contacts are adequately aligned, the method may continue with S2510.

In S2510, layer L2 may be bonded to L1 such as by, for example, a pressure applied by the stamp holding layer L2. In embodiments, the bonding of L2 to L1 may include bonding a plurality of semiconductor devices, such as TFTs, to the circuit layers previously applied to L1. For example, D/S contacts 470 on L2, having been aligned with contacts of the corresponding D/S circuitry 640, 650 on L2, may be bonded by pressing the contacts together. Likewise, the gate interconnects 520 may be bonded by pressure to the gates 660. Further details of the alignment of layers L1 and L2 are shown in FIG. 17.

Figure 17:
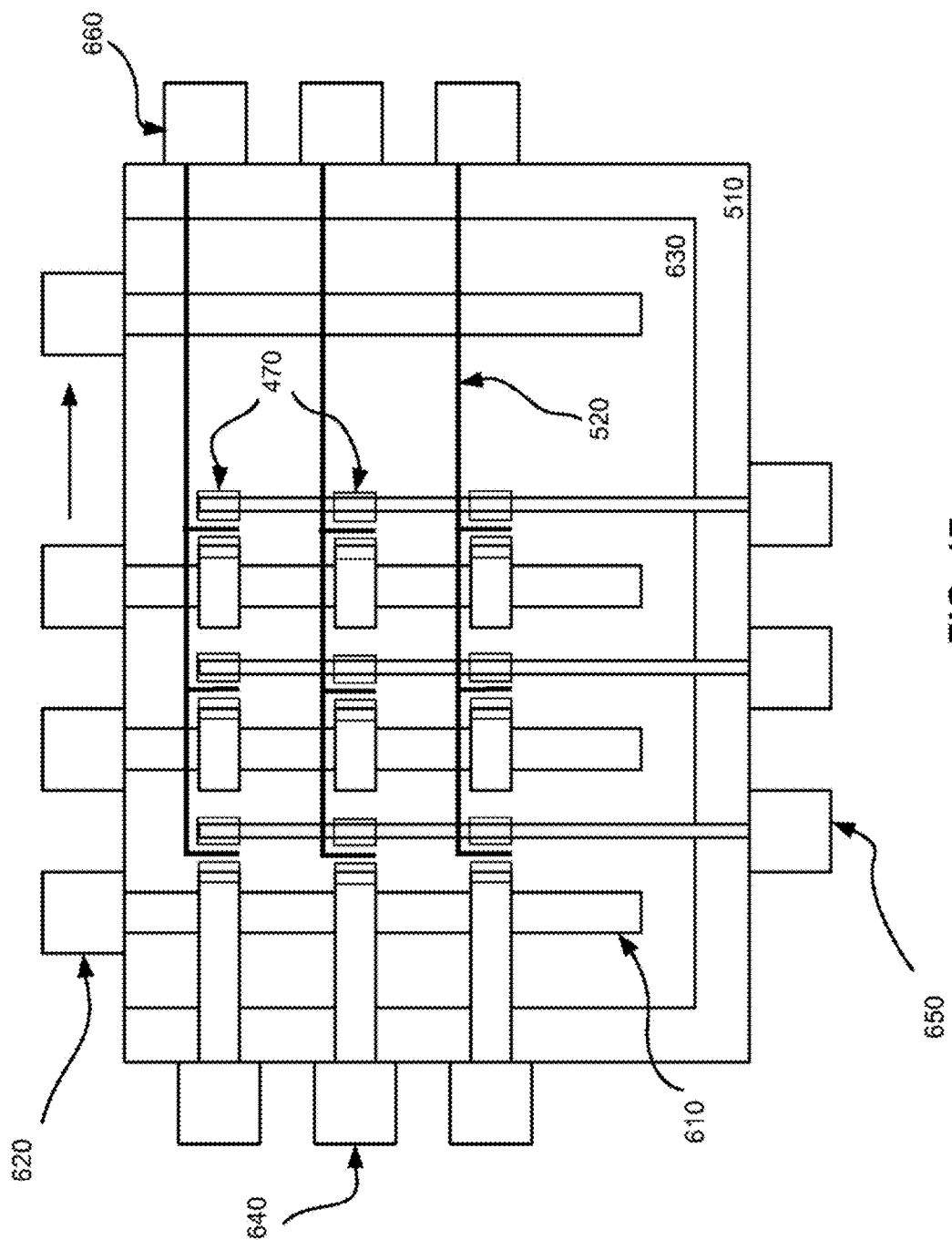
FIG. 17 is a plan view depicting a bonded structure including the components of FIGS. 13 and 16.

FIG. 17 is a plan view showing the combination of layers L1 and L2 as bonded in S2510. As shown in FIG. 17, the various components from L1 are aligned with corresponding parts of L2. For example, gate contacts 660 are aligned with and bonded to gate interconnect lines 520; D/S contacts 470 are aligned with and bonded to scan lines 640, and data lines 650; and, though difficult to depict in a two-dimensional drawing, the substrate 510 may be wrapped around and cover the layer 630 of OPD material.

As mentioned above, in embodiments, including combined layers such as shown in FIG. 17, the bonding of such components may be implemented around a curved substrate, such as a hemispherical substrate, and other shapes described herein. Additional details of a stamping process over a curved substrate are shown in FIGS. 18-20.

Figure 18:
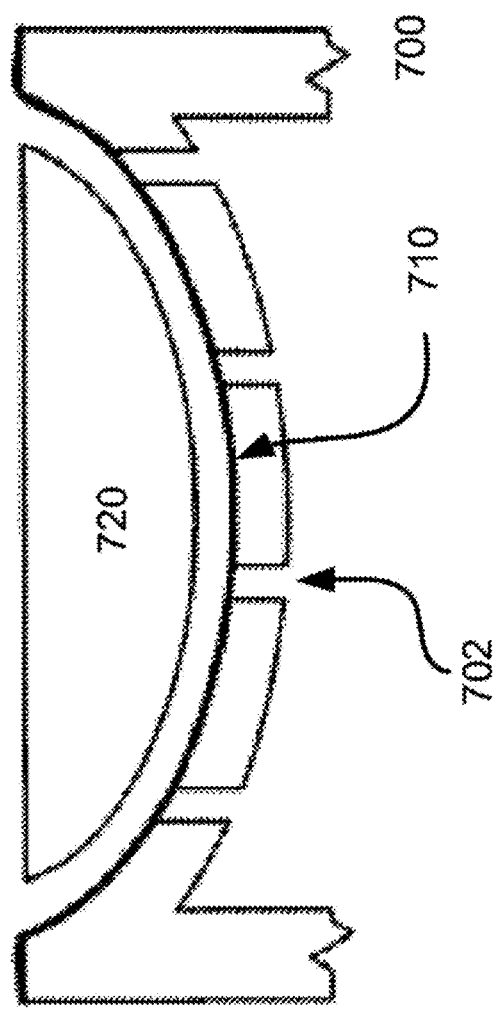
FIGS. 18-20 are schematic views of an exemplary stamp and substrate according to aspects of the invention.

FIG. 18 is a side view showing a vacuum mold 700 and an elastomeric stamp 710. It will be understood that the drawings referred to herein are not drawn to scale, and some features may be exaggerated or omitted for clarity. A curved substrate 720 is positioned opposite the stamp 710. The substrate 720 may include a circuit layer (not shown) and the stamp 710 may hold another circuit layer (not shown) with a plurality of semiconductor devices preformed thereon. According to embodiments, the circuit layer held by the stamp 710 may be transferred to the circuit layer on the substrate 720 by directly applying pressure between the stamp 710 and the substrate 720. In the configuration shown in FIG. 17, the stamp 710 is closely conforming to the contour of the vacuum mold 700. This may be, for example, when a vacuum is applied through channels 702 to the stamp to draw it toward the vacuum mold 700, or may be a steady state of the stamp 710, depending on characteristics of the stamp 710. In embodiments, the circuit layer to be transferred may be applied to stamp 710 before the stamp is deformed, e.g., while in a planar or less round configuration, or it may be applied to stamp 710 after being deformed into the vacuum mold 700. In embodiments where the circuit layer held by the stamp is formed as a substantially planar configuration, the stamp 710 may be used to deform the circuit layer to a three dimensional shape, such as a shape that closely approximates the shape of the substrate that the circuit layer is being bonded to.

In embodiments, a circuit layer including a plurality of semiconductor devices may be adhered to a stamp, such as stamp 710, while the stamp is in a substantially planar configuration. The stamp may then be deformed to change a shape of the circuit layer. In embodiments, the stamp 710 may be deformed into the vacuum mold 700 until it contacts the surface of the mold. While the stamp 710 is deformed into the vacuum mold, such as in FIG. 18, various materials may be placed on the stamp and pressure applied between the stamp and substrate to transfer material from the stamp to the substrate.

Figure 19:
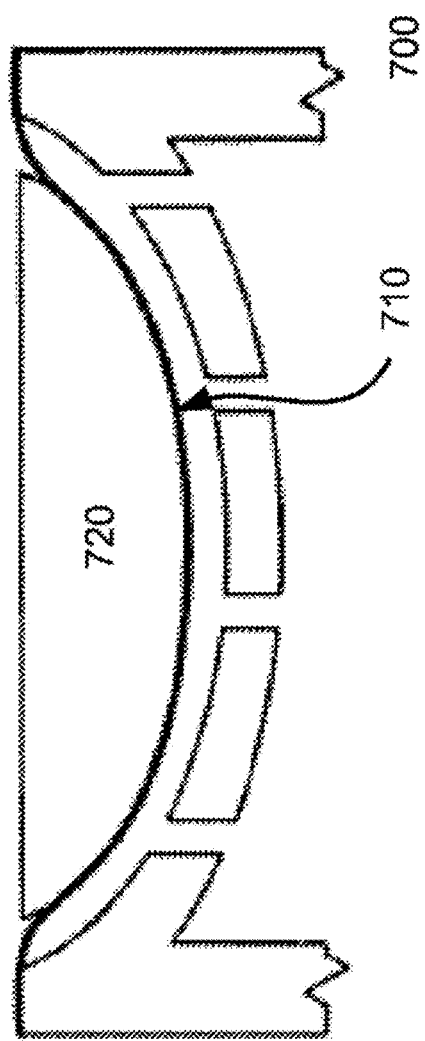
Figure 20:
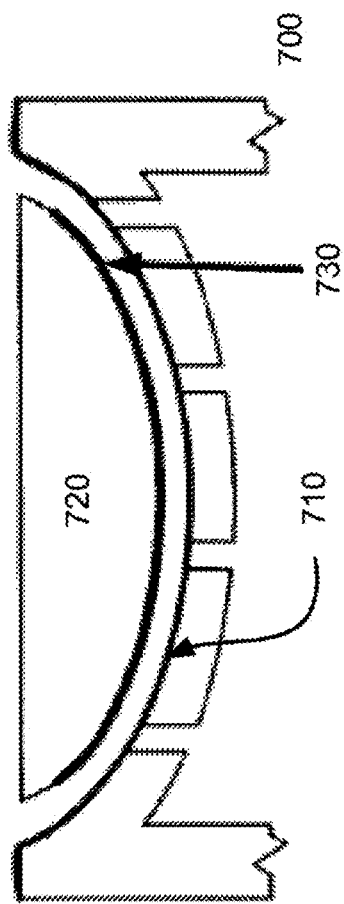

FIG. 19 shows the stamp 710 partially extended from the vacuum mold 700 and positioned so as to apply pressure to the circuit layers (not shown) held between the stamp 710 and the substrate 720. Pressure toward the substrate may be achieved in a plurality of vectors, including various vectors that are substantially normal to the surface of the substrate 720. Pressure may be achieved, for example, by advancing the vacuum mold 700 toward the substrate and/or controlling a vacuum of the vacuum mold 700 to deform/reform the shape of the stamp 710. As shown in FIG. 18, in embodiments, a relatively soft, elastomeric stamp may be used whereby, in certain applications, the force to be applied across the stamp may be more easily applied uniformly such that a relatively low applied force is needed to form a cold welded bond. However, it should be noted that the use of rigid stamps is also contemplated. In embodiments, an elastomeric stamp, such as shown in FIG. 18, may be used to deform around substrate features. Such configurations may be beneficial, for example, in achieving bonding at relatively low pressures, allowing for the application of pressure directly over a device active region with less likelihood of introducing damage thereto.

FIG. 20 shows the stamp 710 withdrawn from the substrate 720, and having deposited the circuit layer 730 on the curved surface of the substrate 720. Deposition of circuit layers onto a non-planar or three dimensional substrate is believed to be useful for a variety of applications, including organic light emitting, photosensitive devices, and other optical applications. The methods described herein, for example, may be used to deposit a circuit layer, including preformed semiconductor devices, onto a non-planar substrate for use in an optoelectronic device. Such devices may include a plurality of organic layers disposed, for example, between metal electrodes. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

In embodiments, the bonding material, or other material to be deposited and transferred, is a metal or a metallic compound, though other materials may be used. For example, the material may be an organic material, insulator, or semiconductor. Organic materials may comprise polymers and/or small molecules. As used herein, the term "organic" includes polymeric materials as well as small molecule organic materials that may be used to fabricate organic optoelectronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule.

As will be appreciated based on the foregoing methods of assembling various electrical devices, according to other aspects of the invention, an electrical circuit device may be provided with various of the features described above, including, for example, a first circuit layer with a plurality of first contacts and a second pre-formed layer including one or more semiconductor devices. The one or more semiconductor devices may include a plurality of second contacts and the plurality of second contacts may be bonded to the plurality of first contacts via a cold welded material. The first circuit layer of the device may be disposed on a curved surface, which may include, for example, a non-developable surface.

Exemplary devices may further include a circuit sublayer under the first circuit layer and a photodiode, or other, material disposed between the circuit sublayer and the first circuit layer. In embodiments, the one or more semiconductor devices of the second pre-formed layer may include an array of thin film transistors and/or the plurality of first contacts may be connected to an array of photodiodes.

The description given above is merely illustrative and is not meant to be an exhaustive list of all possible embodiments, applications or modifications of the invention. Thus, various modifications and variations of the described methods and systems of the invention will be apparent to those skilled in the art without departing from the scope and spirit of the invention. Although the invention has been described in connection with specific embodiments, it should be understood that the invention as claimed should not be unduly limited to such specific embodiments.

What is claimed is:

1. A method of forming an electrical circuit structure comprising:
    providing a circuit sublayer on a first substrate;
    depositing a photodiode material on the circuit sublayer;
    positioning a first circuit layer including a plurality of first contacts on the photodiode material;
    providing a second circuit layer comprising one or more semiconductor devices disposed on a stamp, the second circuit layer including a plurality of second contacts and a plurality of third contacts on a side of the one or more semiconductor devices opposite from the plurality of second contacts; and
    bonding the plurality of second contacts directly to the plurality of first contacts via a pressure applied by the stamp.

2. The method of claim 1, wherein the first circuit layer is disposed on a non-developable surface of the photodiode material.

3. The method of claim 2, wherein the non-developable surface is curved, and the method further comprises aligning the second contacts at least partially around the non-developable curved surface in three dimensions such that the second contacts are aligned with the plurality of first contacts before the bonding.

4. The method of claim 1, wherein the bonding includes cold welding.

5. The method of claim 1, wherein the first circuit layer is stamped over the photodiode material.

6. The method of claim 5, wherein the first circuit layer is stamped on a non-developable surface of the photodiode material.

7. The method of claim 1, wherein the one or more semiconductor devices include an array of thin film transistors and the plurality of first contacts are connected to an array of photodiodes.

8. The method of claim 1
wherein the plurality of second contacts are bonded to the plurality of first contacts via cold welding; and
wherein the first circuit layer is disposed on a curved surface of the photodiode material.

9. The method of claim 8, wherein the first circuit layer is disposed on a non-developable surface of the photodiode material.

10. The method of claim 8, further comprising aligning the second contacts in relation to the curved surface in three dimensions such that the second contacts are aligned with the plurality of first contacts prior to the step of cold welding.

11. The method of claim 8, wherein the circuit sublayer is stamped to the first substrate, and the photodiode material is disposed over the circuit sublayer by deposition.

12. The method of claim 11, further comprising stamping the first circuit layer over the photodiode material.

13. The method of claim 8, wherein the one or more semiconductor devices include an array of thin film transistors and the photodiode material includes an array of photodiodes connected to the plurality of first contacts.

14. The method of claim 1, further comprising the step of constructing the second circuit layer with the steps of:
positioning the semiconductor devices on a second substrate;
positioning the third contacts on the semiconductor devices;
stamping the third contacts to at least one interconnect line;
removing the second substrate; and
positioning the second contacts on the opposite side of the semiconductor devices from the third contacts.

15. A method of forming an electrical circuit structure comprising:
stamping a circuit sublayer on a first substrate;
depositing a photodiode material on the circuit sublayer;
providing a first circuit layer including a plurality of first contacts on the photodiode material;
constructing a second circuit layer with the steps of:
positioning one or more semiconductor devices on a second substrate;
positioning a plurality of third contacts on the semiconductor devices;
stamping the third contacts to at least one interconnect line;
removing the second substrate; and
positioning a plurality of second contacts on the opposite side of the semiconductor devices from the third contacts;
positioning the second circuit layer on a stamp; and
bonding the plurality of second contacts directly to the plurality of first contacts via a pressure applied by the stamp.

* * * * *